US006834428B2

(12) United States Patent
Ravert, Jr. et al.

(10) Patent No.: US 6,834,428 B2
(45) Date of Patent: Dec. 28, 2004

(54) CONNECTOR PRESS

(75) Inventors: W. John Ravert, Jr., Harrisburg, PA (US); Anthony A. Staub, York, PA (US); Gary A. Hitz, New Cumberland, PA (US); Glenn J. Pontius, New Cumberland, PA (US)

(73) Assignee: FCI Americas Technology, Inc., Reno, NV (US)

( * ) Notice: Subject to any disclaimer, the term of this patent is extended or adjusted under 35 U.S.C. 154(b) by 148 days.

(21) Appl. No.: 10/128,797

(22) Filed: Apr. 24, 2002

(65) Prior Publication Data

US 2003/0200653 A1 Oct. 30, 2003

(51) Int. Cl.[7] .................................................. H05K 3/00
(52) U.S. Cl. ........................................... 29/845; 29/842
(58) Field of Search .......................... 29/842, 845, 741, 29/849, 739

(56) References Cited

U.S. PATENT DOCUMENTS

| | | | | |
|---|---|---|---|---|
| 3,849,712 A | | 11/1974 | Lankford et al. | 318/561 |
| 4,058,881 A | * | 11/1977 | Gavin et al. | 29/715 |
| 4,218,817 A | * | 8/1980 | Takano | 29/741 |
| 4,447,700 A | | 5/1984 | Cohen | 219/117.1 |
| 4,486,928 A | | 12/1984 | Tucker et al. | 29/26 A |
| 4,510,683 A | | 4/1985 | Fedde et al. | 29/701 |
| 4,531,192 A | | 7/1985 | Cook | 364/513 |
| 4,538,201 A | | 8/1985 | Wuyts et al. | 361/124 |
| 4,577,284 A | | 3/1986 | Christy et al. | 364/513 |
| 4,590,660 A | * | 5/1986 | Starski | 29/566.3 |
| 4,598,456 A | | 7/1986 | McConnell | 29/407 |
| 4,627,157 A | * | 12/1986 | Campisi et al. | 29/741 |
| 4,631,815 A | | 12/1986 | Bocchicchio et al. | 29/739 |
| 4,705,081 A | * | 11/1987 | Birk et al. | 140/147 |
| 4,744,141 A | * | 5/1988 | Musiani | 29/741 |
| 4,797,994 A | | 1/1989 | Michaud et al. | 29/720 |
| 4,809,425 A | | 3/1989 | Monforte | 29/568 |
| 5,239,739 A | | 8/1993 | Akeel et al. | 29/430 |
| 5,499,443 A | * | 3/1996 | Ota et al. | 29/741 |
| 5,509,192 A | * | 4/1996 | Ota et al. | 29/741 |
| 5,696,687 A | | 12/1997 | DeMotte et al. | 364/468.21 |
| 5,709,025 A | | 1/1998 | Wuyts | 29/748 |
| 5,737,829 A | * | 4/1998 | Wolfe et al. | 29/741 |
| 5,751,847 A | | 5/1998 | Wuyts | 382/165 |
| 5,797,177 A | | 8/1998 | Simmons et al. | 29/739 |
| 5,813,108 A | | 9/1998 | Ryan | 29/564.6 |
| 5,924,192 A | | 7/1999 | Wuyts | 29/833 |
| 5,940,967 A | | 8/1999 | Wuyts et al. | 29/845 |
| 6,021,561 A | * | 2/2000 | Shimamura et al. | 29/741 |
| 6,094,264 A | | 7/2000 | Wuyts | 356/237.1 |
| 6,098,275 A | | 8/2000 | Wuyts et al. | 29/741 |
| 6,178,627 B1 | | 1/2001 | Wuyts | 29/837 |

FOREIGN PATENT DOCUMENTS

| | | |
|---|---|---|
| EP | 0 293 175 A2 | 11/1988 |
| EP | 1 174 964 A1 | 1/2002 |
| WO | WO 98/58527 | 12/1998 |

* cited by examiner

*Primary Examiner*—Carl J. Arbes
(74) *Attorney, Agent, or Firm*—Woodcock Washburn LLP

(57) ABSTRACT

A connector press provides for learning a specified connector pressed position, adjusting a force based threshold, and simultaneously pressing multiple connector types into a circuit board. The force based threshold may be adjusted via a slider bar on a user interface. The specified pressed position may be learned by measuring and storing a position or force value, upon the user causing the press to press the connector into a circuit board. A total force based threshold may be determined in order to simultaneously press multiple connector types. The total force based threshold may be based upon quantities and pressing forces of each of the connectors types. Further, the press may provide near capacity pressing force, even with an asymmetrical load, by including linear guides.

18 Claims, 10 Drawing Sheets

CONNECTOR PRESS

FIELD OF THE INVENTION

The invention relates to presses and more particularly to presses for pressing connectors into circuit boards.

BACKGROUND OF THE INVENTION

Presses have been used to press connectors into circuit boards for so-called "press-fit" type connections. For such connections, a connector includes contact pins and a circuit board includes corresponding holes to receive the contact pins. The press provides the force and motion to press the contact pins into the holes of the circuit board. The connector may be pressed to a specified position or to a specified force.

One problem with pressing the connector to a specified position is that it takes some amount of setup time to determine the specified position. For example, a user typically measures the circuit board thickness with a micrometer, measures the height of the connector, determines the current position of the press, and calculates and enters a position into a controller. Such a process may take an unacceptably long time. Further, such a process may result in an unacceptable amount of incorrectly pressed connectors due to measurement error, calculation error, data entry error, or the like. Therefore, a need exists for a user-friendly way for a press to determine a specified pressed position.

Pressing the connector to a specified force presents another problem. To adjust the pressing depth, a user either enters a force threshold or a force-distance ratio threshold. Such concepts may be difficult to comprehend and therefore may lead to errors and incorrectly pressed connectors. Therefore, a need exists for a user-friendly way to adjust a force based threshold.

Yet another problem exists with pressing multiple connectors to a force based threshold. Conventional presses are typically configured to press one connector at a time. To simultaneously press multiple connectors into a circuit board, a user typically looks up the force threshold for one connector type and multiplies by the number of connectors to determine a total force. The process becomes more complex when more than one type of connector is to be pressed. Moreover, if the connectors are of different heights, the press may be used in a multi-stage technique, pressing the smallest connectors on the first stage, then pressing the next larger connectors on the next stage, etc. Such multi-stage pressing may take an unacceptable amount of time. Therefore, a need exists for a user-friendly technique for simultaneously pressing multiple connectors into a circuit board.

Another problem that exists with pressing multiple connectors is that many presses cannot provide full capacity pressing force if the connectors are not located symmetrically about the center of a pressing platen. That is, if a connector is located at an end of the pressing platen, the press may not be able to press at its full capacity. Therefore, a need exists for a press that can provide near full capacity pressing force, even with an asymmetrical load.

SUMMARY OF THE INVENTION

The invention is directed to user-friendly systems and methods for learning a specified pressed position, adjusting a force based threshold, simultaneously pressing multiple connectors into a circuit board, simultaneously pressing multiple connectors of various heights into the circuit board, and to a press that can provide near capacity pressing force, even with an asymmetrical load.

According to an aspect of the invention, a press is provided for pressing a connector into a circuit board. The press comprises a linear motion source, a platen mechanically coupled to the linear motion source, and linear guides mechanically coupled to opposite sides of the platen to provide for asymmetric forces about the center of the platen. The linear motion source may comprise a servo motor and a ball screw that converts the motor rotation to linear motion. Each linear guide may comprise a linear bearing.

According to another aspect of the invention, a method is provided for adjusting a connector pressed depth in a press. The method comprises displaying a slider bar on a user interface. The slider bar represents a pressing force based threshold. An adjusted pressing force based threshold is received from the user interface via the slider bar. A press force is determined (e.g., measured) and platen motion is stopped if the determined press force is greater than the adjusted pressing force based threshold. The slider bar may comprise a first arrow that increases the pressing force based threshold and a second arrow that decreases the pressing force based threshold. The adjusted pressing force based threshold may be limited between a first limit value and a second limit value.

According to another aspect of the invention, a method is provided for adjusting a connector pressed depth in a press that presses a connector into a circuit board. The method comprises receiving an indication that a pressing platen has been positioned at a position wherein the connector is pressed in the circuit board. A value corresponding to the connector pressed position is determined and stored. The value may be a position value or a force value. The position value may be determined by reading an encoder value and converting the encoder value to a linear position value. The force value may be determined by measuring a value from a load cell, converting the measured value to a force value, and determining a maximum force value based on the converted force value.

According to yet another aspect of the invention, a method is provided for simultaneously pressing a plurality of connectors into a circuit board. The method comprises determining a plurality of connector types to be pressed into the circuit board. A quantity of each connector type is determined. A pressing force based threshold for each connector type is determined. A total force based threshold is determined based upon the determined quantities and pressing force based thresholds. The platen may be caused to move in a direction to press the plurality of connectors into the circuit board. A force acting upon the platen is determined (e.g., measured) and platen motion is stopped if the determined force is equal to or greater than the determined total force based threshold.

According a further aspect of the invention, an apparatus is provided for simultaneously pressing a first connector having a first connector height and a second connector having a second connector height into a circuit board. The apparatus comprises a platen, a first fixture, and a second fixture. The first fixture is coupled to the platen and has a height such that first connector height and the first fixture height sum to a predefined height. The second fixture is coupled to the platen and has a height such that second connector height and the second fixture height sum to about the same predefined height, whereby the first and second connectors can be simultaneously pressed into the circuit board.

The above-listed features, as well as other features, of the invention will be more fully set forth hereinafter.

BRIEF DESCRIPTION OF THE DRAWINGS

The invention is further described in the detailed description that follows, by reference to the noted drawings by way of non-limiting illustrative embodiments of the invention, in which like reference numerals represent similar parts throughout the drawings. As should be understood, however, the invention is not limited to the precise arrangements and instrumentalities shown. In the drawings.

DETAILED DESCRIPTION OF ILLUSTRATIVE EMBODIMENTS

Figure 1A:
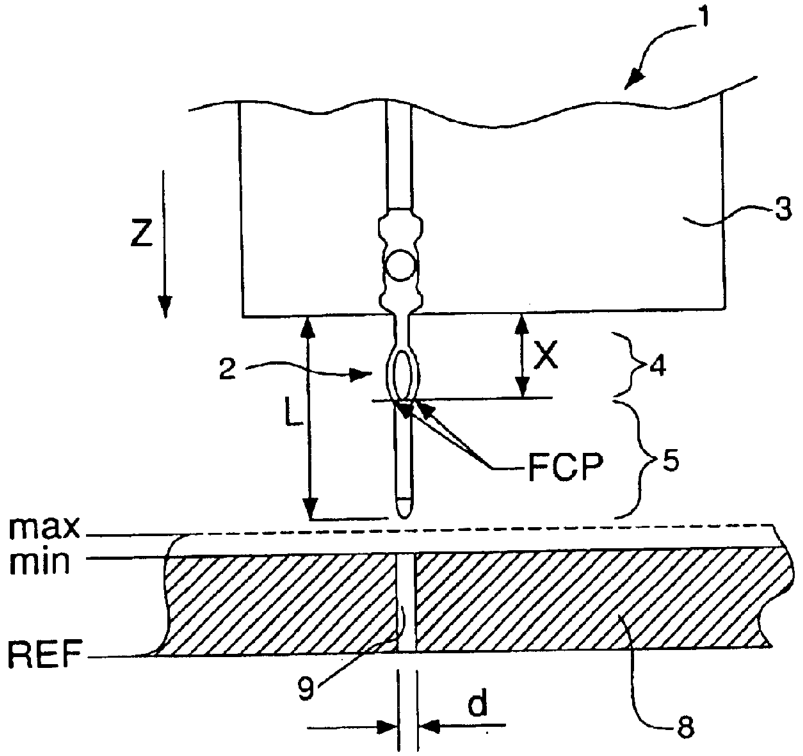
FIG. 1*a* is a side view of an exemplary connector and an exemplary circuit board which can be pressed together using an illustrative press, in accordance with an embodiment of the invention.

Certain terminology may be used in the following description for convenience only and is not considered to be limiting. For example, the words "left", "right", "upper", and "lower" designate directions in the drawings to which reference is made. Likewise, the words "inwardly" and "outwardly" are directions toward and away from, respectively, the geometric center of the referenced object. The terminology includes the words above specifically mentioned, derivatives thereof, and words of similar import.

As shown in FIG. 1*a*, a connector 1 may include a contact pin 2 that extends from a body section 3. Pins 2 may have a compliant section 4 and a non-compliant section 5. U.S. Pat. No. 6,098,275 to Wuyts et al., incorporated by reference herein in its entirety, describes such a connector and a technique for pressing the connector 1 in a circuit board 8. Briefly, when pressing the contact pin 2 into the circuit board 8, the non-compliant section 5 guides the pin 2 into a hole 9 of the circuit board 8 and the compliant section 4 deforms to secure the connector 1 to the board 8.

Figure 1B:
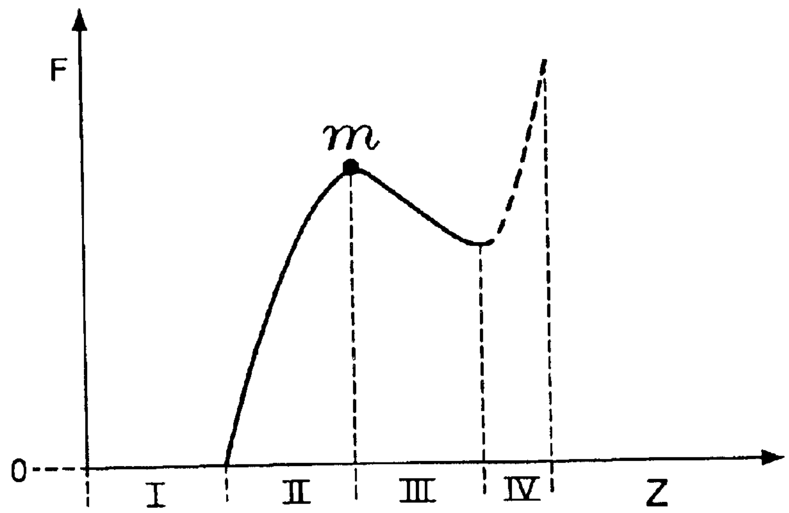
FIG. 1*b* is a chart of an exemplary force versus distance characteristic of pressing an exemplary connector to an exemplary circuit board.

The force on the contact pin varies along the insertion length, as shown in FIG. 1*b*. That is, when pressing the pin into the board, the non-compliant section of the pin is first inserted into a hole, thus obtaining initial guidance for the pin. At this point, there is virtually no pressing force. When the compliant section reaches the upper edge of the hole, the pressing force increases as the compliant section of the pin is deformed in order to generate a retention force (i.e., the force of the pin against the wall of the hole). As the pin is pressed further into the hole, the pressing force decreases slightly due to the fact that the maximum deformation force of the compliant section has been overcome. If the connector body is pressed into contact with the surface of the circuit board, the pressing force increases quickly. Considering these characteristics of pressing a connector into a circuit board, the invention provides a user-friendly press and user interface.

Figure 2A:
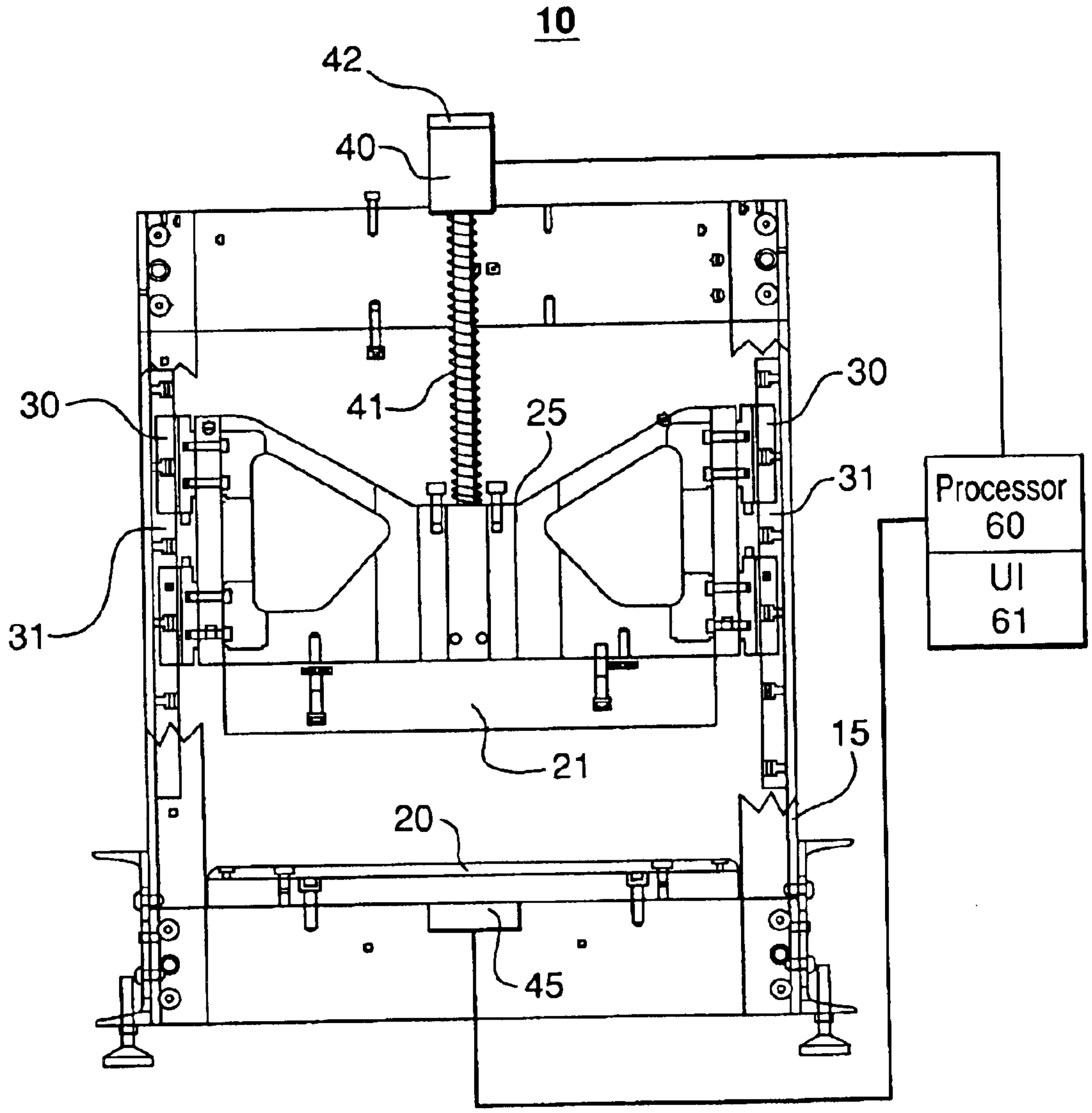
FIG. 2*a* is a front view of an illustrative press, in accordance with an embodiment of the invention.
Figure 2B:
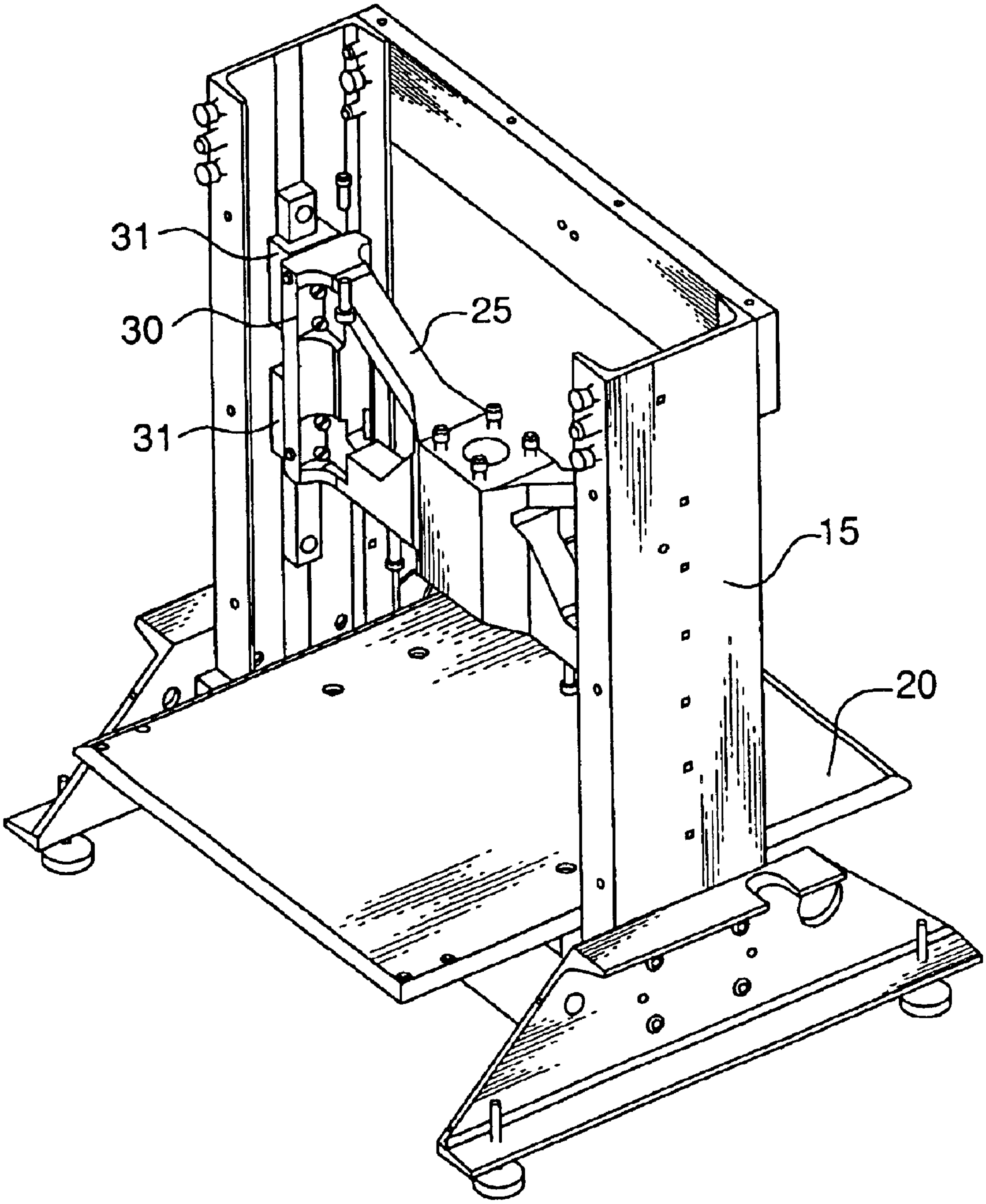
FIG. 2*b* is a perspective view of an illustrative press, in accordance with an embodiment of the invention.

FIGS. 2*a* and 2*b* show an illustrative press, in accordance with an embodiment of the invention. As shown in FIG. 2*a*, press 10 comprises a frame 15 that supports a lower platen 20. Frame 15 is generally shaped to define an area for connector pressing (e.g., square as shown, rectangular, and the like). Lower platen 20 is generally planar in shape and can support a circuit board (not shown). Lower platen 20 has a load cell 45 attached thereto for measuring the pressing force applied to lower platen 20 (and thus the pressing force applied to the circuit board).

Frame 15 also supports a gantry 25 via linear bearings 30 and rails 31. A linear bearing 30 and a rail 31 support each side of gantry 25, thereby counteracting unbalanced forces that may be applied to gantry 25 during pressing. That is, a connector can be pressed into a circuit board and the connector can be located substantially anywhere along the length of gantry 25 (for example, on the left side, on the right side, in the center, etc.). The linear bearings 30 counteract asymmetrical forces on gantry 25, and allow near capacity pressing force to be pressed on a connector, regardless of the location of the connector relative to the center of gantry 25.

Conventional press gantries are typically supported from the center of the gantry. As such, conventional presses typically operate at full capacity only if the object being pressed is located proximate the center of the press. Otherwise, if the object is located proximate an end of the gantry, the press typically cannot provide the full rated capacity of the press to the object.

Typically, rail 31 is generally rectangularly shaped with grooves (not shown) disposed along the length of rail 31. The grooves can receive correspondingly shaped linear bearings 30. Linear bearings 30 may include ball bearings (not shown) for smooth operation. While linear bearings are shown, other linear guides may be used, such as for example, posts and bearings, and the like.

Gantry 25 is moved along rails 31 via a ball screw 41 and a motor 40. Motor 40 is mechanically coupled to frame 15 and a rotor (not shown) of motor 40 is mechanically coupled to ball screw 41, thereby rotating ball screw 41 upon motor 40 rotation. Motor 40 is typically a servo motor for increased speed and position control. Motor 40 may also comprise an encoder 42 for determining motor 40 rotation (and therefore for determining gantry 25 linear position). Encoder 42 may alternatively be a resolver, or the like.

Ball screw 41 is mechanically coupled to gantry 25, thereby linearly moving gantry 25 upon rotation of ball screw 41. Ball screw 41 typically is a high precision ball screw with low backlash. Alternatively, motor 40 and ball screw 41 may comprise other linear motion sources, such as, for example, a linear motor, a rotational motor and mechanical gears, and the like.

A pressing platen 21 is mechanically coupled to gantry 25 for contacting connectors (not shown) and pressing the connectors into the circuit board. Typically, pressing platen 21 is generally rectangularly shaped and has a flat surface for contacting connectors. Pressing platen 21 may have one face that contacts connectors placed on the circuit board. The face typically is a flat surface, however, the face may include a stepped contour to appropriately interface with multiple connectors of different heights.

Alternatively, to accommodate multiple connectors of different heights, a tool may be provided to "level" the multiple connectors of different heights (i.e., such that they may be pressed at the same time). In this manner, a pressing platen with a single flat surface can simultaneously press multiple connectors having different heights. Further, machining multiple pressing platens with different stepped contour configurations may be avoided. The tool comprises fixtures of various heights to mate with connectors of different heights, as described in more detail below. Moreover, the fixtures can be mixed and matched to accommodate a variety of connectors and circuit board configurations.

Press 10 further comprises a processor 60 that controls press 10 and a user interface 61 that can receive user entered information and commands (e.g., via a keyboard, mouse, stylus, and the like) and can display user information (e.g., via a display monitor or the like). Processor 60 receives information and commands from user interface 61 and information from encoder 42 and load cell 45. Processor 60 further controls motor 40, for example, via a "servo-control" unit (not shown) and an amplifier (not shown).

Figure 3:
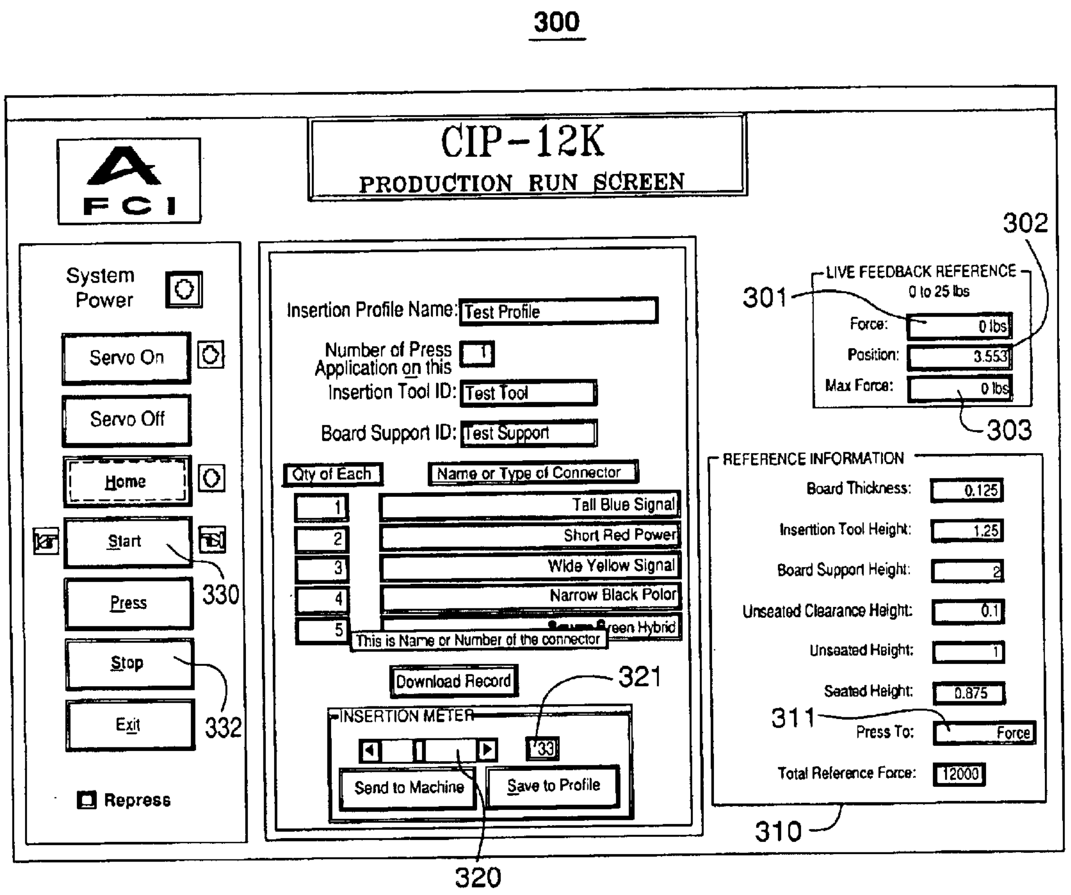
FIG. 3 is a screen shot of an illustrative production display useful for directing and monitoring the pressing of a connector into a circuit board, in accordance with an embodiment of the invention.

Processor 60 may cause screens to be displayed on user interface 61. FIG. 3 is a screen shot of an illustrative production display 300 for pressing a connector into a circuit board with press 10. As shown in FIG. 3, display 300 may include a force field 301 that displays the current force experienced by load cell 45, a position field 302 that displays the position of pressing platen 21, and a maximum-force field 303 that displays the maximum force experienced by load cell 45 during a pressing cycle.

Display 300 may also include a section 310 that displays reference information, such as, for example, board thickness, tool height, and the like. Section 310 also typically includes a control scheme field 311 that displays the selected control scheme. The control scheme may be either a force based control scheme or a position based control scheme. Display 300 further includes a start button 330 that may be used to select the start of pressing a connector into a board and a stop button 332 that may be used to select stopping the pressing process.

Display 300 also includes a slider bar 320 for adjusting the force based threshold. As shown, slider bar 320 may include left and right arrows that increase and decrease, respectively, the value of the force based threshold. That is, if a user selects (for example, by clicking on a mouse, touching a touch screen, or the like) the left arrow, the value is decreased. If the user selects the right arrow, the value is increased. Alternatively, slide bar 320 may include a sliding portion that a user can select and slide along the length of slider bar 320. Slider bar 320 has a corresponding force based threshold value display 321. As shown, the force based threshold has a value of '33'. This value can be modified by a user selecting an arrow as described above.

The force based threshold may be a force threshold. In this case, the force threshold value represents a force value that triggers processor 60 to cause press motion to stop. For example, if the force threshold value is '1000' pounds, upon processor 60 measuring a press force greater than '1000' pounds, processor 60 causes press motion to stop, for example, by sending a stop command to the servo control unit.

The force based threshold may also be a force-distance ratio threshold. In this case, the force-distance ratio threshold represents an increase in force per distance that triggers processor 60 to cause press motion to stop. For example, if the force-distance ratio threshold is '100' pounds per micrometer, upon processor 60 determining that the measured press force has increased by greater than '100' pounds per micrometer, processor 60 causes press motion to stop. The increase in force may also be measured on a time basis rather than a distance basis.

Moreover, the force-distance ratio threshold may be displayed on slider bar 320 as an angle. In this case, processor 60 converts between angle units, such as degrees representative of the slope of the force per distance, and the force-distance threshold, e.g., in units of pounds per micrometer. A force-distance ratio angle displayed in degrees may be easier for a user to understand than a force-distance ratio displayed in pounds per micrometer.

Further, slider bar 320 may be configured to limit the range of the force based threshold. For example, if the force based threshold is a force-distance ratio displayed in angle units, the range may be limited to a low value of '1' degree and a high value of '80' degrees.

Further, a maximum-force based threshold may be encoded in the program, stored in a register, or the like, to store a separate force based threshold. In this manner, even if slider bar 320 malfunctions or the user enters an incorrect value, processor 60 may still stop press motion upon reaching the maximum-force based threshold.

Display 300 may further include a send to machine button 324. Upon processor 60 receiving a user selection of send to machine button 324, processor 60 may write the value of slider bar 320 to the force based threshold. Display 300 may further include a save to profile button 325. Upon processor 60 receiving a user selection of save to profile button 325, processor 60 may write the value of slider bar 320 to a profile. Such selection may be limited based on a user security level. The profile may associate a connector and circuit board combination with the force based threshold. In this manner, different force based thresholds may be stored and associated with different connector and circuit board combinations.

Figure 6:
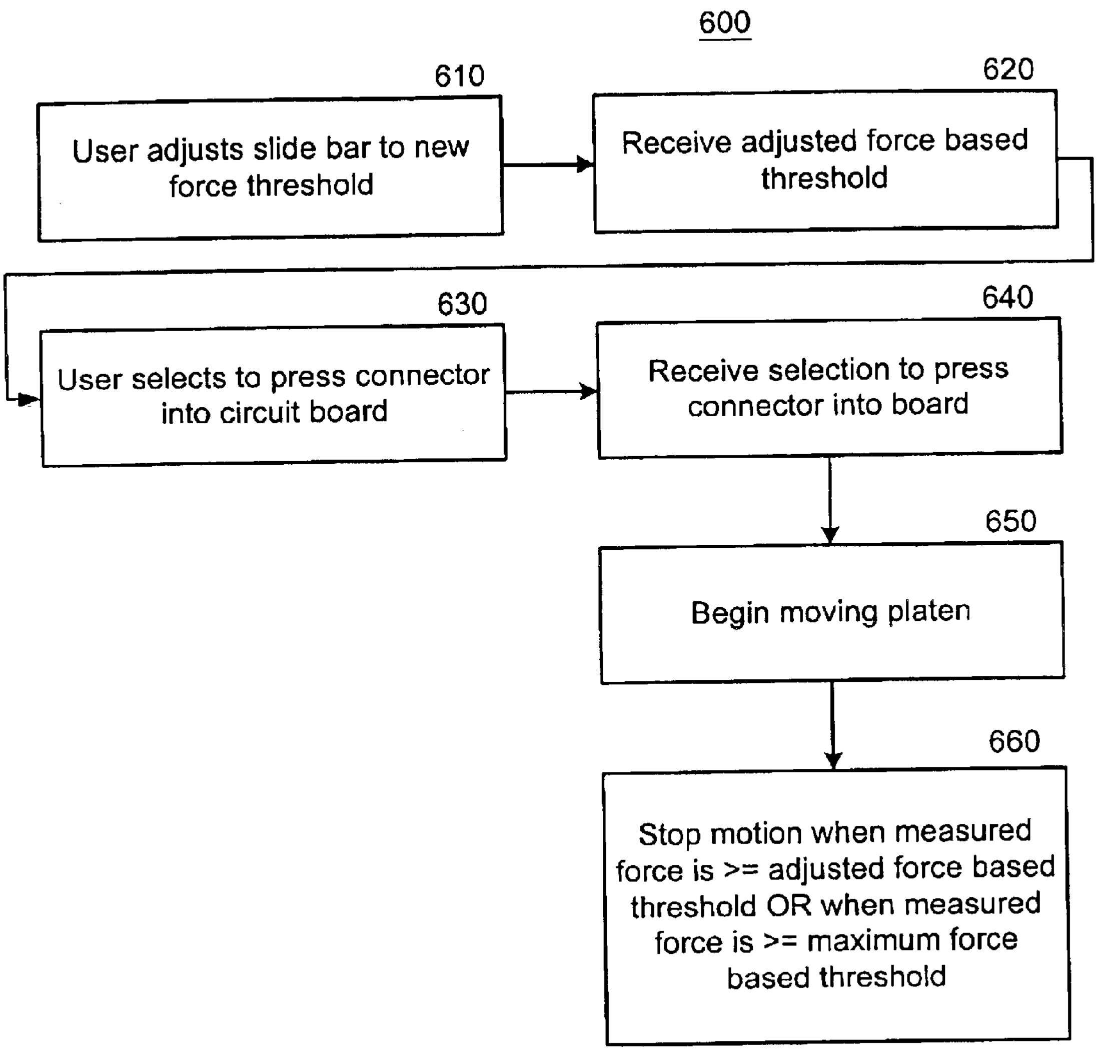
FIG. 6 is a flow chart of an illustrative method for adjusting a connector pressed depth, in accordance with an embodiment of the invention.

FIG. 6 is a flow chart of an illustrative method for adjusting a force based threshold that may be performed from display 300. For example, if a force based threshold of '33' results in a pressed connector that is higher than desired, the user may increase the force based threshold via slider bar 320.

Such a modification may be performed at step 610 via arrow selection by the user, rather than via numeric entry. At step 620, processor 60 receives the value that was adjusted via slider bar 320.

At step 630, the user selects to start pressing a connector (using the adjusted force based threshold) by selecting start button 330, for example. At step 640, processor 60 receives the selection to start pressing a connector into the circuit board.

At step 650, processor 60 causes motor 40 to begin advancing pressing platen 21 towards lower platen 20.

At step 660, processor 60 causes motor 40 to stop when the measured force (e.g., measured via load cell 45) is greater than or equal to either the adjusted force based threshold or the maximum-force based threshold. In this manner, regardless of how the force based threshold is adjusted, the maximum-force based threshold still limits the force applied. Such a process allows a user a convenient way to adjust the pressed depth by adjusting a threshold value with a user-friendly slider bar.

Another method for adjusting or controlling a connector pressing amount is "teaching" press 10 the parameters associated with a successfully pressed connector. The parameters may include, for example, a measured platen position or a measured platen force. That is, rather than physically measuring a connector and a circuit board and entering the information into processor 60, the user can press a connector into a circuit board and processor 60 can "learn" the parameters associated with a successful press.

Figure 4:
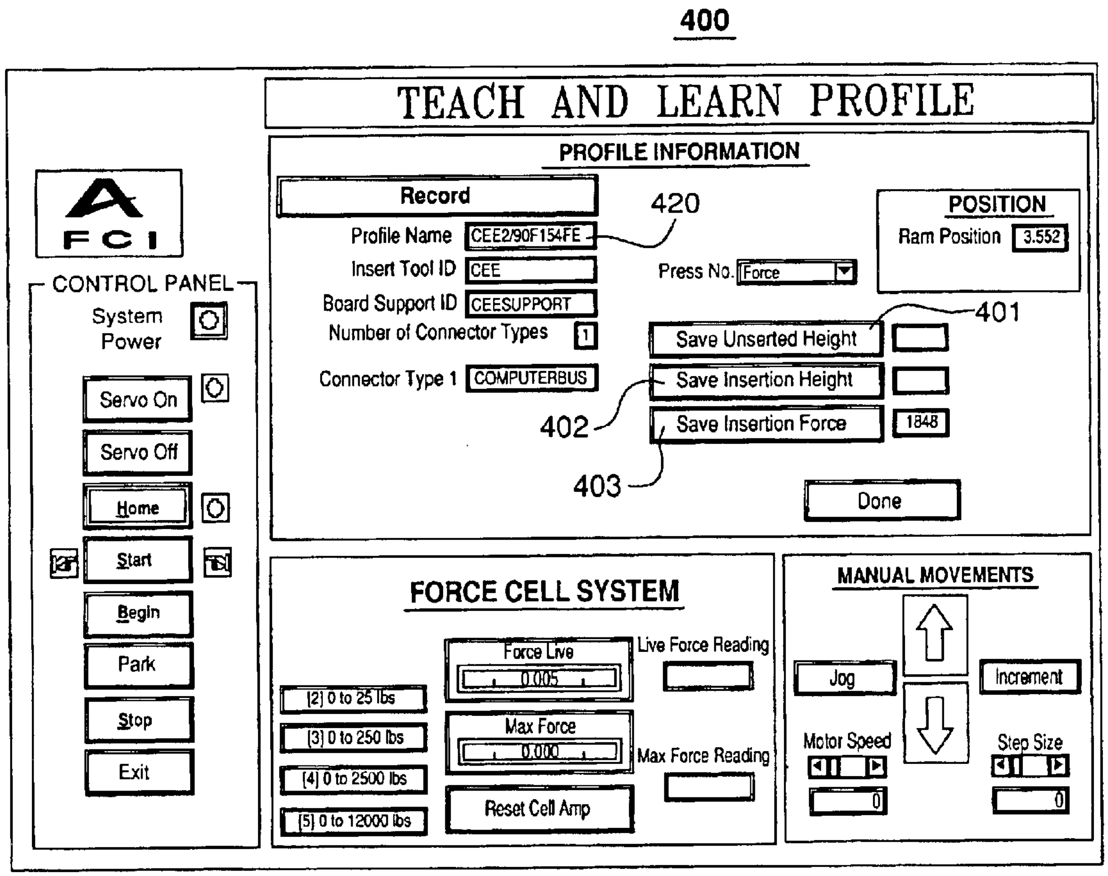
FIG. 4 is a screen shot of an illustrative display useful for "teaching" a position threshold or a force based threshold to a press, in accordance with an embodiment of the invention.

FIG. 4 shows a screen shot of an illustrative display 400 for teaching parameters to press 10. As shown in FIG. 4, display 400 may include a profile field 420 that receives and displays a profile name or an identification that represents a connector and circuit board combination. With such a field, learned parameters can be stored and associated with the connector and circuit board combination. Display 400 may also include a save unseated height button 401, a save insertion height button 402, and a save insertion force button 403 which a user may use to save particular learned parameters.

Figure 7:
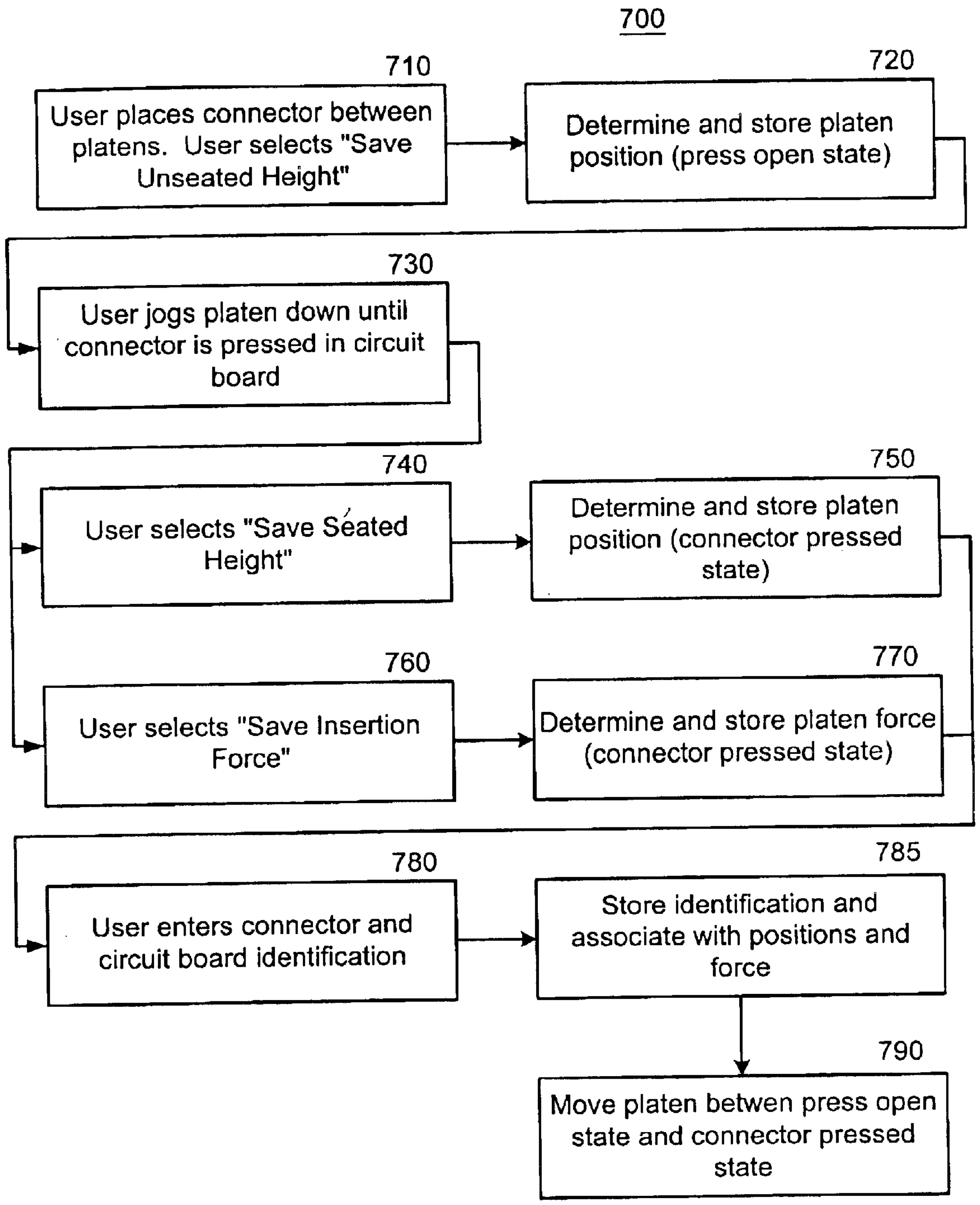
FIG. 7 is flow chart of an illustrative method for "teaching" a position threshold or a force based threshold to a press, in accordance with an embodiment of the invention.

FIG. 7 is a flow chart of an illustrative method for "teaching" parameters to a press that may be performed from display 400. For example, a user may open press 10 and physically place a connector and a circuit board between lower platen 20 and pressing platen 21.

At step 710, the user selects save unseated (i.e., the connector is not yet pressed) height button 401. At step 720, processor 60 receives the selection of button 401 and determines and stores a position value (for example, by reading information from encoder 42). The stored position value represents the position of pressing platen 21 in the press open state or connector not pressed state.

At step 730, the user jogs or moves pressing plate 21 down until pressing the connector to the desired height above the circuit board, until contacting the connector to the circuit board, until reaching a desired force, or the like. The jogging or moving may be implemented via physical push buttons, such as two-hand style push buttons. In this manner, the user selects a desired amount of pressing for the connector and amount of pressing is "learned" by processor 60. That is, processor 60 can determine position information or force information associated with the user controlled pressing of a connector and store the information, as described in more detail below.

At step 740, the user selects save insertion height button 402. At step 750, processor 60 receives the selection of button 402 and determines and stores a position value (for example, from encoder 42). The stored position value represents the position of pressing platen 21 in the press closed state or connector pressed state.

At step 760, the user selects save insertion force button 403. At step 770, processor 60 receives the selection of button 403 and determines and stores a force value (for example, from load cell 45). The stored force value represents the maximum force experienced during pressing of the connector to the press closed state or connector pressed state. As such, processor 60 retains the maximum force read from load cell 45 during steps 710 through 730 and may reset the maximum force value upon beginning a learn cycle. The user may perform both steps 740 and 760, or only one of steps 740 and 760.

At step 780, the user enters a profile name or an identification in profile field 420. The profile name may represent a particular connector and circuit board and may be used to relate the learned/stored parameters to the particular connector and circuit board combination. At step 785, processor 60 receives the profile name or identification entered in field 420 and stores the profile name or identification. Further, the profile name is associated with the positions and the force determined and stored in steps 720, 750, and 770. The storing and associating can be accomplished by storing the profile name or identification, the stored positions, and the stored force in data store in the form of a spreadsheet, a file, a relational database, and the like. In this manner, if a particular connector and circuit board combination are used often, their associated learned parameters (i.e., stored positions and force) may be retrieved from a data store rather than by performing another teach cycle.

At step 790, pressing platen 21 moves between the open state and the closed state. The open state is determined by the position stored in step 720. The closed state is determined by the position stored in step 750 if the selected control scheme is position based, or by the force stored in step 770 if the selected control scheme is force based.

Figure 5:
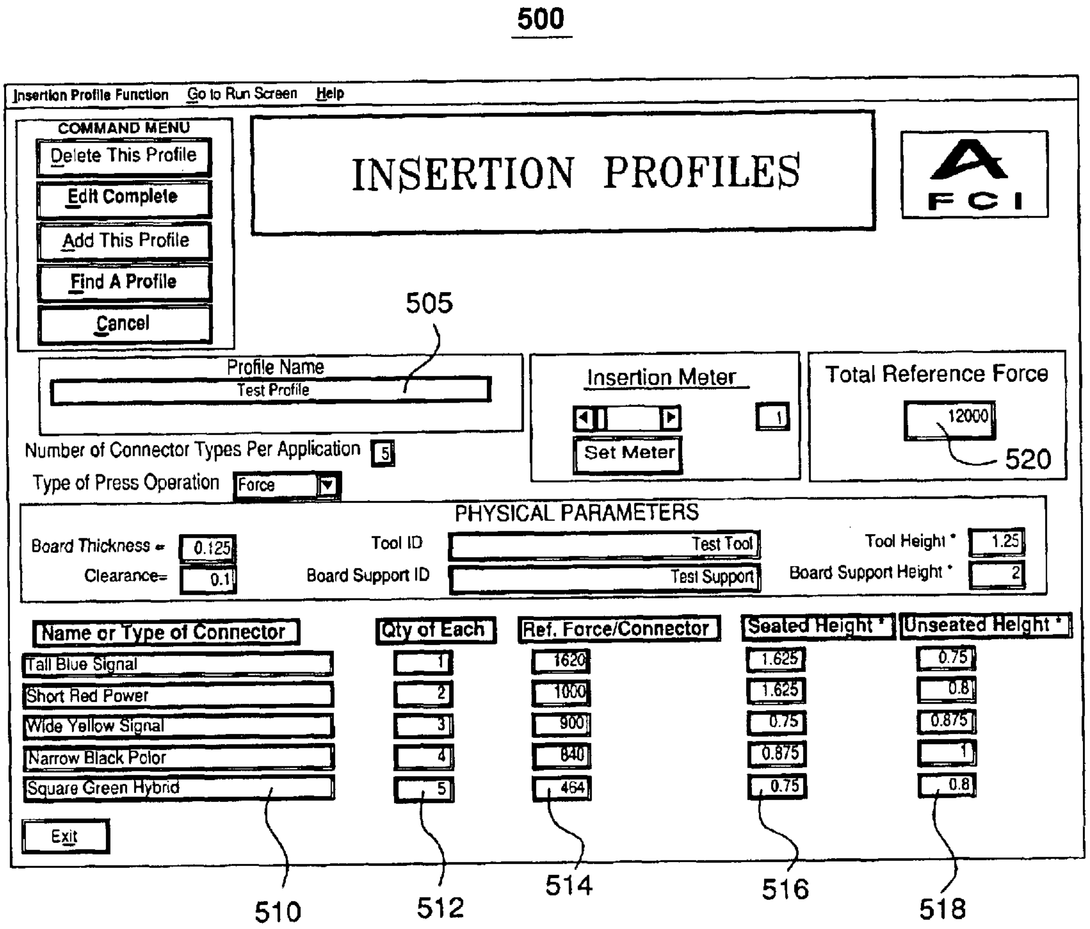
FIG. 5 is a screen shot of an illustrative display useful for directing and monitoring the pressing of multiple connectors into a circuit board, in accordance with an embodiment of the invention.

In addition to pressing a connector into a circuit board, the invention provides a user-friendly system and method for simultaneously pressing multiple connectors into a circuit board. FIG. 5 shows a screen shot of an illustrative display 500 for simultaneously pressing multiple connectors into a circuit board. As shown in FIG. 5, display 500 may include a profile name field 505 for receiving a profile name or an identification that represents a combination of connectors and a circuit board. With such a field, parameters can be stored and associated with a combination of multiple connectors and a circuit board.

Display 500 may also include connector name fields 510, connector quantity fields 512, force threshold per connector fields 514, connector seated (i.e., pressed) position fields 516, connector unseated (i.e. not pressed) position fields 518, and a total force based threshold (i.e., total reference force) field 520. Connector names fields 510 may display and receive a connector type name or identification. Connector quantity fields 512 may display and receive a quantity of a corresponding connector type. Force threshold per connector fields 514 may display and receive a value representing the force to be used for pressing of each corresponding connector type. Connector seated position fields 516 may display and receive a position of a corresponding connector type with the connectors pressed in a circuit board. Connector unseated position fields 518 may display and receive a position of a corresponding connector type with the connectors unseated (i.e., not yet pressed in a circuit board). Total force base threshold field 520 may display and receive a force of a corresponding connector type with the connectors pressed in a circuit board. The user may enter information into the above described fields to set up press 60 for a pressing cycle. Alternatively, the user may enter a profile name or identification that has such information stored and associated with the profile name or identification.

In such a case, the stored associated information would be displayed in the appropriate fields.

Figure 8:
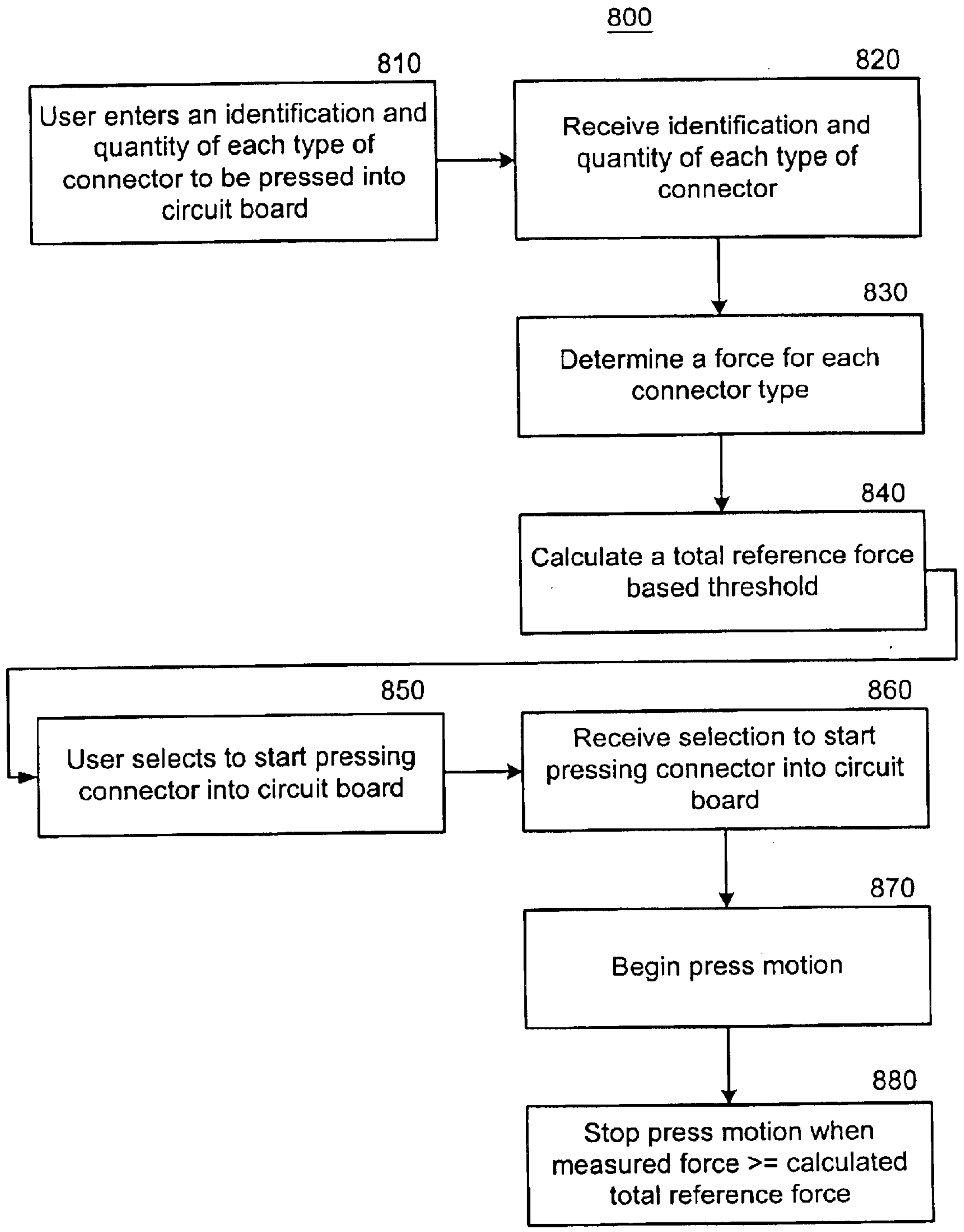
FIG. 8 is a flow chart of an illustrative method for determining a force based threshold for pressing multiple connectors into a circuit board, in accordance with an embodiment of the invention.

FIG. 8 is a flow chart of an illustrative method that may be performed from display 500. At step 810, the user enters an identification of a connector type, for each connector type to be pressed, into connector name fields 510. Further, the user enters an indication of a quantity of connectors of each connector type into connector quantity fields 512.

Alternatively, the user enters a profile name or identification in profile name field 505. In this case, the profile name or identification is mapped to a plurality of connector types, a quantity corresponding to each of the connector types, and a force per connector threshold value corresponding to each of the connector types.

At step 820, processor 60 receives the indication of connector type, for each connector type to be pressed, and the indication of a quantity of connectors for each connector type.

At step 830, processor 60 determines a force based threshold for each connector type. The force based threshold may be determined based upon a stored mapping between force based thresholds and connectors and circuit boards. Alternatively, the force based threshold may be determined by receiving a user entered force based threshold value form force threshold per connector fields 514.

At step 840, processor 60 calculates a total reference force based threshold, based on the forces determined at step 830 and the quantities determined at step 820. For example, given the connector quantities displayed in connector quantity fields 512 and the forces displayed in force threshold per connector fields 514, processor 60 calculates a total reference force of '12,000,' as displayed in total force base threshold field 520.

At step 850, the user selects to start pressing the connectors into the circuit board. At step 860, processor 60 receives the selection to start pressing and then at step 870, causes motor 40 to begin advancing pressing platen 21 towards lower platen 20.

At step 880, processor 60 causes motor 40 to stop when the measured force (e.g., measured via load cell 45) is greater than or equal to the total reference force based threshold.

Figure 9:
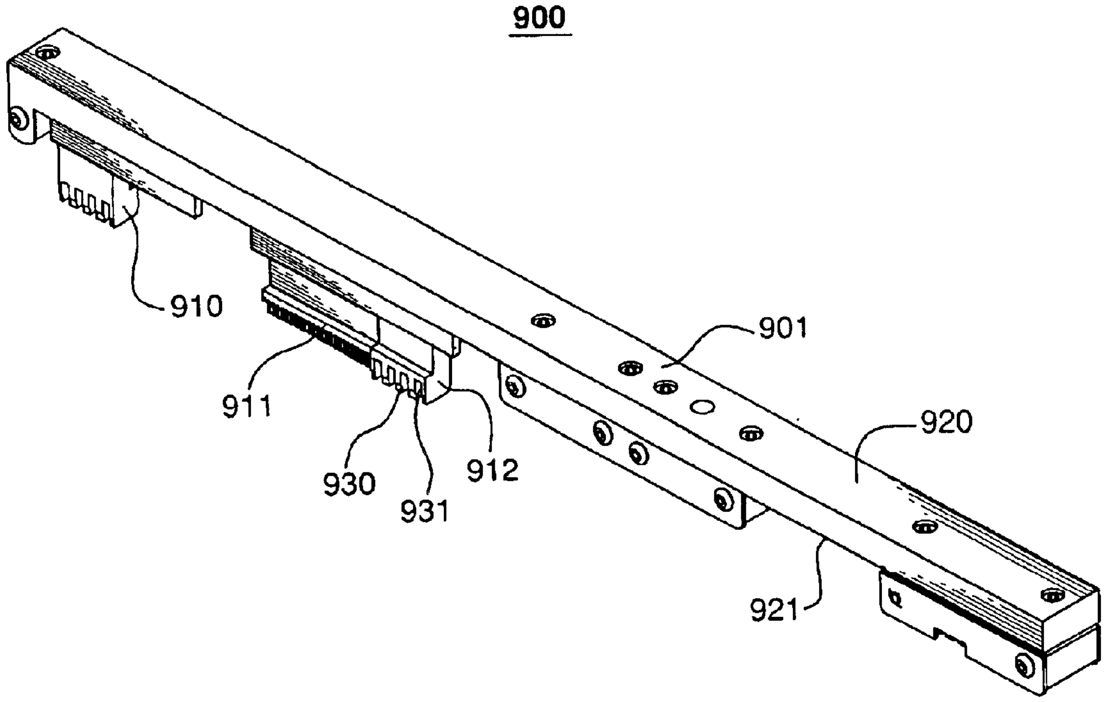
FIG. 9 is a perspective view of an illustrative tool including illustrative fixtures for pressing multiple connectors of various heights into a circuit board, in accordance with an embodiment of the invention.

In addition to pressing multiple connectors to a total reference force based threshold, the invention is directed to an apparatus for simultaneously pressing multiple connectors having various heights into a circuit board. As shown in FIG. 9, tool 900 comprises a platen 901 having a top 920 and a bottom 921. Top 920 is adapted to interface with pressing platen 21 (i.e., a surface of pressing platen 21 may contact top 920 of platen 901 to press connectors into a circuit board.

Tool 900 further comprises a plurality of fixtures 910, 911, 912 of various heights. Each fixture 910, 911, 912 is adapted to mate to a corresponding connector. That is, each fixture 910, 911, 912 may be a different height, depending on the height of its corresponding connector. Further, each fixture 910, 911, 912 may be adapted to contact the connector at predetermined locations. For example, fixture 912 has extended portions 930 and recesses 931 therebetween. Extended portions 930 may be adapted to contact a structurally sound portion of its corresponding connector. Recesses 931 may correspond to and receive connector blades that would otherwise be damaged by pressing.

Fixtures 910, 911, 912 may be connected to platen 901 with fasteners (not shown), such as, for example, a screw, a bolt, and the like. Tool 900 may then be placed on the connectors to be inserted in the circuit board. Then, pressing platen 21 advances toward platen 901 to press the connectors into the circuit board. With such fixtures 910, 911, 912, a user may arrange and attach fixtures to platen 901 in a variety of ways to simultaneously press multiple connectors of different heights in various configurations.

In the foregoing description, it can be seen that the invention provides user-friendly systems and methods for learning a specified pressed position, adjusting a force based threshold, pressing multiple connectors into a circuit board to a total force based threshold, simultaneously pressing multiple connectors of various heights into the circuit board, and a press that can provide near capacity pressing force, even with an asymmetrical load.

Portions of the invention may be embodied in the form of program code (i.e., instructions) stored on a computer-readable medium, such as a magnetic, electrical, or optical storage medium, including without limitation a floppy diskette, CD-ROM, CD-RW, DVD-ROM, DVD-RAM, magnetic tape, flash memory, hard disk drive, or any other machine-readable storage medium, wherein, when the program code is loaded into and executed by a machine, such as a computer, the machine becomes an apparatus for practicing the invention. Portions of the invention may also be embodied in the form of program code that is transmitted over some transmission medium, such as over electrical wiring or cabling, through fiber optics, over a network, including the Internet or an intranet, or via any other form of transmission, wherein, when the program code is received and loaded into and executed by a machine, such as a computer, the machine becomes an apparatus for practicing the invention. When implemented on a general-purpose processor, the program code combines with the processor to provide a unique apparatus that operates analogously to specific logic circuits.

It is to be understood that the foregoing illustrative embodiments have been provided merely for the purpose of explanation and are in no way to be construed as limiting of the invention. Words which have been used herein are words of description and illustration, rather than words of limitation. Further, although the invention has been described herein with reference to particular structure, materials and/or embodiments, the invention is not intended to be limited to the particulars disclosed herein. Rather, the invention extends to all functionally equivalent structures, methods and uses, such as are within the scope of the appended claims. Those skilled in the art, having the benefit of the teachings of this specification, may affect numerous modifications thereto and changes may be made without departing from the scope and spirit of the invention.

What is claimed is:

1. A method for adjusting an amount that a press presses a connector into a circuit board, the method comprising:

displaying a slider bar on a user interface, the slider bar representing a pressing force based threshold;

receiving an adjusted pressing force based threshold from the user interface via the slider bar;

determining a press force; and causing platen motion to stop if the determined press force is greater than the adjusted pressing force based threshold.

2. The method as recited in claim 1, wherein determining a press force comprises measuring the press force via a load cell.

3. The method as recited in claim 1, wherein the slider bar comprises a first arrow that increases the pressing force based threshold and a second arrow that decreases the pressing force based threshold.

4. The method as recited in claim 1, further comprising limiting the adjusted pressing force based threshold between a first limit value and a second limit value.

5. The method as recited in claim 1, further comprising:

receiving a second pressing force based threshold; and causing platen motion to stop if the determined press force is greater than the second pressing force based threshold.

6. The method as recited in claim 5, wherein the receiving comprises receiving a second pressing force based threshold from a data store.

7. The method as recited in claim 1, wherein displaying comprises displaying a slider bar on a user interface, the slider bar representing a pressing force threshold.

8. The method as recited in claim 1, wherein displaying comprises displaying a slider bar on a user interface, the slider bar representing a pressing force-distance ratio threshold.

9. The method as recited in claim 1, wherein displaying comprises displaying a slider bar on a user interface, the slider bar representing a pressing delta force-distance ratio threshold.

10. A method for adjusting an amount that a press presses a connector into a circuit board, the method comprising:

receiving an indication that a pressing platen has been positioned at a position wherein the connector is pressed in the circuit board;

measuring a value corresponding to the connector pressed position;

storing the measured value upon receiving the indication that the pressing platen has been positioned at the connector pressed position; and using the stored measured value in pressing the connector in the circuit board.

11. The method as recited claim 10, wherein measuring the value comprise measuring a position value.

12. The method as recited in claim 11, wherein measuring the position value comprises reading an encoder value and converting the encoder value to a linear position value.

13. The method as recited in claim 11, further comprising causing the pressing platen to move until the pressing platen reaches the stored measured position value.

14. The method as recited in claim 10, wherein measuring the value comprises measuring a force value.

15. The method as recited in claim 14, wherein measuring the force value comprises measuring a value from a load cell, converting the measured value to a force value, and determining a maximum force value based on the converted force value.

16. The method as recited in claim 14, further comprising causing the pressing platen to move until reaching the determined force value.

17. The method as recited in claim 10, further comprising:

receiving an indication that the pressing platen has been positioned at a second position above the connector;

measuring a second position value corresponding to the second position; and storing the second position value upon receiving the indication that the pressing platen has been positioned at the second position.

18. The method as recited in claim 17, further comprising causing the pressing platen to move between a position corresponding to the measured value wherein the connector is pressed in the circuit board and a position corresponding to the second position value.

* * * * *